United States Patent [19]

Hirata et al.

[11] Patent Number: 5,528,145

[45] Date of Patent: Jun. 18, 1996

[54] HIGH-SPEED MAGNETIC RESONANCE IMAGING METHOD

[75] Inventors: Satoshi Hirata; Yoshitaka Bito, both of Kokubunji; Etsuji Yamamoto, Akishima, all of Japan

[73] Assignees: Hitachi, Ltd.; Hitachi Medical Corporation, both of Tokyo, Japan

[21] Appl. No.: 275,348

[22] Filed: Jul. 15, 1994

[30] Foreign Application Priority Data

Jul. 30, 1993 [JP] Japan .................................. 5-189623

[51] Int. Cl.$^6$ .................................................. G01R 33/20
[52] U.S. Cl. ........................................... 324/309; 324/307
[58] Field of Search ................................. 324/300, 307, 324/309; 128/153.2

[56] References Cited

U.S. PATENT DOCUMENTS

| | | | |
|---|---|---|---|
| 4,593,247 | 6/1986 | Glover | 324/309 |
| 4,902,973 | 2/1990 | Keren | 324/307 |
| 4,952,876 | 8/1990 | Pelc | 324/309 |
| 4,992,736 | 2/1991 | Stormont et al. | 324/309 |
| 5,201,311 | 4/1993 | Bottomley et al. | 324/309 |

OTHER PUBLICATIONS

Hore, "Solvent Suppression in FT NMR"; J of Mag Res vol. 55, pp. 283–300 (1983).
Mansfield et al, "Biological & Medical Imagig by NMR"; vol. 29 pp. 355–373 (1978).
Mansfield, "Spatial Mapping Chemical Shift in NMR"; Mag Res in Med vol. 1 pp. 370–386 (1984).
Matsui, "Spatially Resolved NMR Spectroscopy Using Phase Modulated Spin Echo Trains"; J. of Mag Res vol. 67 pp. 476–490 (1986).
Quarterly of Applied Mathematics, vol. 2. No. 2 pp. 164–168 (1944).
Frahm et al, "Chemical Shift Selective MR Imaging Using Whole body Magnet"; Radiology vol. 156 pp. 441–444 (1985).
Journal of Magnetic Resonance, vol. 29, pp. 355–373 (1978).

*Primary Examiner*—Sandra L. O'Shea
*Assistant Examiner*—Raymond Y. Mah
*Attorney, Agent, or Firm*—Antonelli, Terry, Stout & Kraus

[57] ABSTRACT

A high-speed magnetic resonance spectroscopic imaging method for obtaining information relating to an object placed in a space by irradiating the object placed in the space applied with a static magnetic field and field gradients in three different directions so as to excite a nuclear spin in the object. At least one of the field gradients is applied while inverting a sign thereof periodically and a magnetic resonance signal generated by excitation of the nuclear spin is measured. A Fourier transform is applied to the measured magnetic resonance signal thereby to obtain a chemical shift image and a measurement spectral bandwidth is set to a value not larger than a frequency difference between two different chemical shifts having frequencies remotest from each other among a plurality of chemical shifts intended to be measured, the measurement spectral bandwidth being determined by a reciprocal of an inversion period of the field gradient which is applied while inverting a sign thereof periodically. The method enables setting of spatial resolution and spectral bandwidth independently.

17 Claims, 7 Drawing Sheets

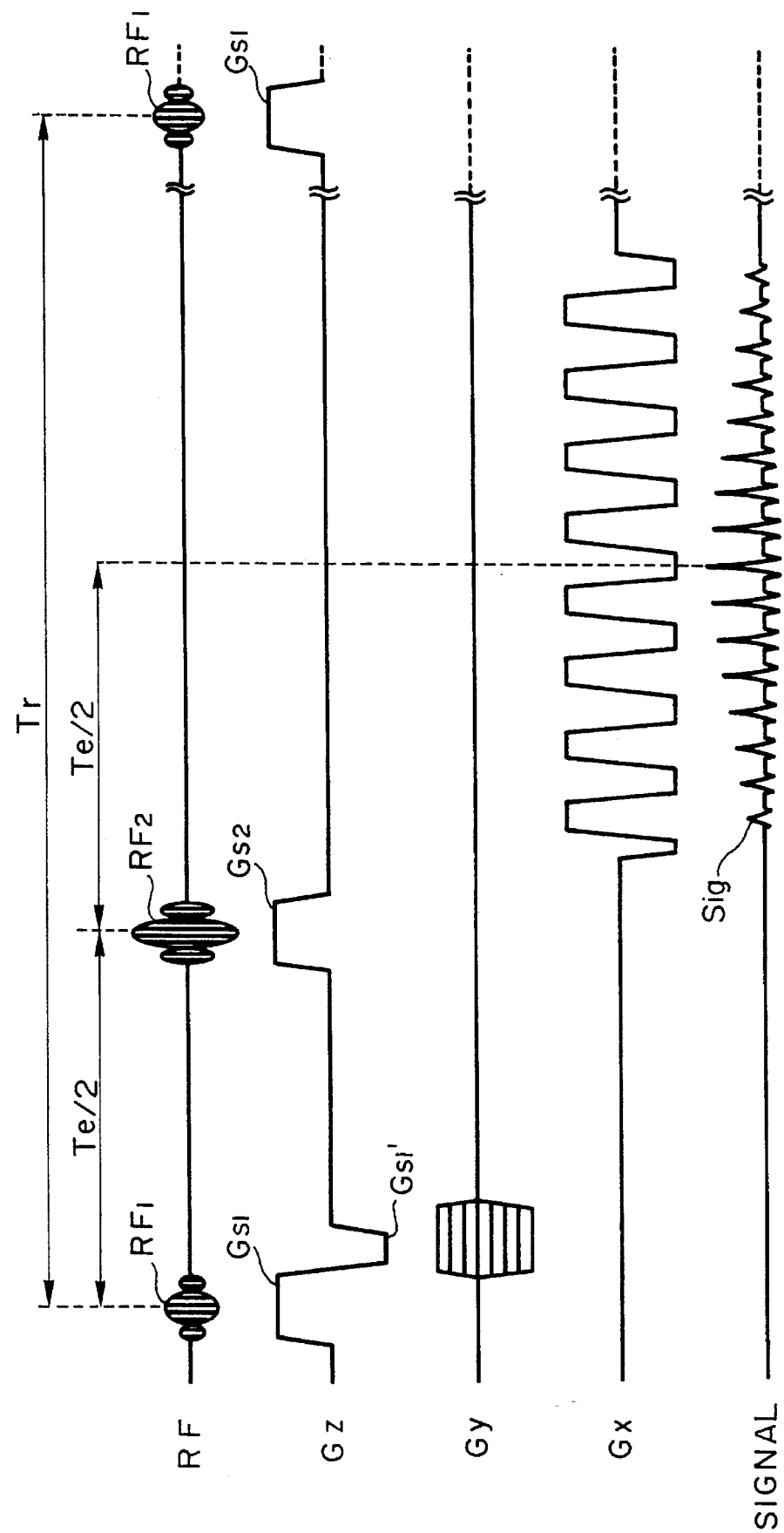

HIGH-SPEED MAGNETIC RESONANCE IMAGING METHOD

BACKGROUND OF THE INVENTION

The present invention relates to magnetic resonance imaging, and more particularly to a method suitable for measuring internal distribution of information relating to chemical shift of an organism at a high speed.

As a magnetic resonance spectroscopic imaging for measuring internal distribution of information relating to the chemical shift of an organism at a high speed (hereinafter referred to as MRSI), an EPSM method and a PREP method proposed by Mansfield described in Magnetic Resonance in Medicine, Vol. 1, pp. 370–386 (1984) or the like, and a multiple encoding method proposed by Matsui described in Journal of Magnetic Resonance, Vol. 67, pp. 476–490 (1986) or the like are known. In these methods, a sign of field gradient is reversed periodically, thereby to achieve a high speed using echoes (hereinafter referred to as echo train) generated consecutively, and a measurable spectral bandwidth is determined by an inverse number of the inversion period of the field gradient. In order to widen this spectral bandwidth, a shorter inversion period of the field gradient is required. When the inversion period of the field gradient is simply shortened in order to widen the bandwidth, however, spatial resolution of an obtained chemical shift image is lowered due to a limited switching period of time of the field gradient. In other words, when the spatial resolution of a chemical shift image is improved, a measurable spectral bandwidth is narrowed.

SUMMARY OF THE INVENTION

In a conventional high-speed MRSI method, there has been a problem that it is impossible to set each of the spatial resolution and the measurable spectral bandwidth independently since the measurable spectral bandwidth is narrowed when the spatial resolution of the chemical shift image is improved. For example, even when a switching period of time of a field gradient becomes much faster than the present switching period of time due to the progress of techniques and the inversion period of the field gradient can be shortened in the future, such a problem that an eddy current generated in an organism is increased and the influence exerted on a physiological function becomes no longer negligible is surmised. Therefore, it is conceived that there is a problem in simply widening the spectral bandwidth.

It is an object of the present invention to solve the above-mentioned problems in the high-speed MRSI method and provide magnetic resonance imaging capable of setting spatial resolution and spectral bandwidth independently.

A first method of the present invention is featured in that, in magnetic resonance imaging in which an object placed in a space applied with a static magnetic field, and field gradients in three different directions is irradiated with a radiofrequency pulse, thereby to excite nuclear spin, a magnetic resonance signal generated with the above is measured, Fourier transform is applied to the measured magnetic resonance signal, and at least any of a chemical shift spectrum, a chemical shift image and an atomic nucleus density image is obtained, there is provided a step for setting a measurement spectral bandwidth to a value not larger than a frequency difference between the remotest in frequency two types of chemical shifts among a plurality of chemical shifts intended to be measured.

There is a feature in this method that a step for setting at least either a bandwidth of a measurement spectral bandwidth or a center frequency of a measurement spectral bandwidth is provided further, and a peak in the measurement spectral bandwidth and a peak of a magnetic resonance signal generated by the peak of a magnetic resonance signal located outside the measurement spectral bandwidth aliasing inward the measurement spectral bandwidth are made not to overlap each other. For example, there is provided a step that, in magnetic resonance imaging in which an object placed in a space where a static magnetic field is applied with a field gradient in a first direction for selecting a slice and is also irradiated with a radiofrequency pulse for exciting nuclear spin, a field gradient in a second direction for encoding a phase is applied in the next place, the field gradient in the first direction is applied and a radiofrequency pulse for inverting the excited nuclear spin is also applied after the lapse of a predetermined period of time, a magnetic resonance signal generated by applying a field gradient in a third direction while inverting the sign thereof periodically is measured, and Fourier transform is applied to the measured magnetic resonance signal so as to obtain at least any of a chemical shift spectrum, a chemical shift image and an atomic nucleus density image, a measurement spectral bandwidth is set to a value not larger than the frequency difference between the remotest in frequency two types of chemical shifts among a plurality of chemical shifts intended to be measured and at least either a bandwidth of a measurement spectral bandwidth or a center frequency of the measurement spectral bandwidth is set, and a peak in the measurement spectral bandwidth and a peak of a magnetic resonance signal generated by a peak of a magnetic resonance signal located outside the measurement spectral bandwidth aliasing inward the measurement spectral bandwidth are arranged not to overlap each other. Namely, the spectral bandwidth observed in measurement of an echo train one time is adopted, instead of the whole spectral bandwidth having a predetermined bandwidth, as a certain restricted bandwidth narrower than the whole bandwidth, a measurement spectral bandwidth determined by an inverse number of a period of inverting a sign of field gradient is set to a value smaller than the frequency difference between the remotest in frequency two types of chemical shifts among n types of chemical shifts intended to be measured with separation, and an original set value and a center frequency of the measurement bandwidth are adjusted, thereby to arrange so that the peak located outside the measurement spectral bandwidth not to show aliasing inward the measurement bandwidth and overlap the peak in the measurement bandwidth in the chemical shift spectrum after image reconstruction processing. Furthermore, in the detection of a magnetic resonance signal, there is a feature that at least the sign of field gradient in one direction among field gradients in a plurality of directions is inverted periodically in application.

A second method of the present invention is featured in that there is further provided a step of separating a peak of a magnetic resonance signal where a peak in the measurement spectral bandwidth described with reference to the first method and a peak of a magnetic resonance signal produced by a peak of a magnetic resonance signal located outside the measurement spectral bandwidth aliasing inward the measurement spectral bandwidth overlap each other by means of arithmetic processing. As an example of arithmetic processing, it is possible to separate an overlapped waveform by using a damped least squares method proposed by Levenberg described in Quarterly of Applied Mathematics Vol. 2, No. 2, pp. 164–168 (1944) or the like.

A third method of the present invention is featured in that, in magnetic resonance imaging in which an object placed in a space where a static magnetic field, field gradients in different three directions, i.e., a first, a second and a third directions, are applied is irradiated with a radiofrequency pulse thereby to excite nuclear spin in the object, a magnetic resonance signal generated with such excitation is measured, and Fourier transform is applied to the measured magnetic resonance signal so as to obtain at least any of a chemical shift spectrum, a chemical shift image and an atomic nucleus density image, there are provided a step for setting the bandwidth of the radiofrequency pulse to a value smaller than the frequency difference between the closest in frequency two types of chemical shifts among a plurality of chemical shifts intended to be measured and setting a center frequency to the frequency of a predetermined chemical shift, and a step for bringing a predetermined type of nuclear spin in the slice of the object selected by the field gradient in any direction into an excited state by the radiofrequency pulse having the center frequency and bringing nuclear spin of the slice in the vicinity of the above-mentioned slice into a saturated state.

In particular, the third method comprises a first step of irradiating the object with a radiofrequency pulse with a bandwidth not larger than the frequency difference between the closest two types of chemical shifts among a plurality of chemical shifts intended to be measured, and with the center frequency set to the frequency of a predetermined chemical shift for exciting a predetermined nuclear spin while applying the field gradient in a first direction for selecting a slice in the object, a second step of irradiating the object with a radiofrequency pulse inverted in phase by 180° with respect to the pulse radiated in the first step while applying the field gradient in the first direction with the sign inverted so as to excite nuclear spins other than the predetermined nuclear spin, a third step of applying at least one of field gradients in the first, the second and the third directions so as to have nuclear spins excited in the first step and the second step other than the predetermined nuclear spin pseudo-saturated, a fourth step of irradiating the radiofrequency pulse applied in the first step or the second step while applying the field gradient in the first direction so as to excite a predetermined nuclear spin, and a fifth step for measuring a magnetic resonance signal generated as the result of the fourth step.

In detailed terms, characteristic features are constituted in that the first step to the fifth step are repeated for every type of chemical shift of a plurality of chemical shifts intended to be measured, the first step to the fifth step are repeated for every type of chemical shift of a plurality of chemical shifts intended to be measured within a period of time for waiting for nuclear magnetization to recover, the repetition time interval for repeating the first step to the fifth step is made shorter as compared with longitudinal relaxation time of the nuclear spin intended to be measured, and the field gradient in at least one direction among field gradients in a plurality of directions is applied while the sign thereof being inverted periodically in the fifth step.

According to the present method, the whole region of a spectrum having a certain bandwidth is not measured at a time, but only the regions where peaks intended to be measured are in existence are measured individually. Besides, it is possible to set a spectral bandwidth to be measured arbitrarily up to a value of a peak width of a peak intended to be measured when a magnetic resonance signal is detected.

In the first to the third methods which have been described so far, there is also a feature that measurement using prescan, i.e., a pulse sequence in which application of field gradients for providing spatial information is eliminated before the present measurement is made is performed.

According to the feature of the first method, it is possible to improve spatial resolution by setting the measurement spectral bandwidth determined by an inverse number of a period for inverting a sign of field gradient to a value smaller than the frequency difference between the remotest in frequency two types of chemical shifts among n types of chemical shifts intended to be measured. A spectral bandwidth observed in the measurement of an echo train one time is adopted as a certain restricted bandwidth narrower than the whole region in place of the whole region of a spectrum having a predetermined bandwidth. Although a peak located outside a measurement spectral bandwidth shows aliasing inward the measurement bandwidth for overlapping sometimes in a chemical shift spectrum after image reconstruction processing, it is possible to vary the position where the peak outside the measurement bandwidth shows aliasing inward the measurement bandwidth for overlapping in accordance with the Nyquist's sampling theorem depending on the size of the measurement bandwidth and the center frequency of the measurement bandwidth, thereby to adjust so as to avoid overlapping with a peak in the bandwidth. Thus, it is possible to expand a substantial measurement spectral range. Namely, it becomes possible to set the spatial resolution and the spectral bandwidth independently.

When it is impossible to adjust so as to avoid the overlapping with a peak in the measurement bandwidth, it is possible to separate an overlapped waveform by means of arithmetic processing as described in the second method, thus making it possible to expand the substantial measurement spectral range. Namely, it becomes possible to set the spatial resolution and the spectral bandwidth independently.

According to the features of the third method, only the regions where peaks intended to be measured are measured individually without measuring the whole spectrum region having a certain bandwidth at a time. Therefore, it is possible to eliminate uselessness of measuring a region where a useful peak does not exist, and furthermore, it is possible to expand a substantial measurement spectral range by placing obtained peaks in a row in an axial direction of a chemical shift. Further, it is possible to set the spectral bandwidth when a peak corresponding to one chemical shift is measured arbitrarily to a value of the peak width of the peak, thereby to improve the spatial resolution. Thus, it is possible to set the substantial measurement spectral range and the spatial resolution independently.

However, in order to measure only the regions where peaks intended to be measured are in existence individually, in other words, in order to perform excitation of every nuclear spin of an atomic nucleus having a chemical shift intended to be measured and signal measurement thereof, it is required to selectively pseudo-saturate nuclear spins of other atomic nuclei having chemical shifts other than the object of measurement. Because, when pseudo-saturation is not performed, even if the field gradient for slice selection is applied and a radiofrequency pulse with the bandwidth restricted is radiated so as to excite only the nuclear spins of atomic nuclei having chemical shifts intended to be measured in the selected slice, nuclear spins of atomic nuclei having chemical shifts other than the object of measurement included in the slice positioned differently from the selected slice are also excited at the same time.

In the third method, a frequency bandwidth of an applied radiofrequency pulse is set to below the frequency difference between the closest in frequency two types of chemical shifts among n types of chemical shifts which are the objects of separation with respect to an object including atomic nuclei having a plurality of chemical shifts, a center frequency of the radiofrequency pulse is set to the frequency of the predetermined chemical shift, and the field gradient for selecting the slice is applied and the radiofrequency pulse is also radiated, thereby to excite selectively nuclear spins in the slices which do not overlap each other for respective atomic nuclei having different chemical shifts. In succession, the field gradient for selecting a slice with gradient inverted is applied and a radiofrequency pulse with the phase inverted by 180° is radiated, thereby to return the nuclear spin of the atomic nuclei having a chemical shift corresponding to the center frequency of the radiofrequency pulse to a thermal equilibrium state, and nuclear spin in a slice different from the previously selected slice is excited selectively with respect to nuclear spin of atomic nuclei having chemical shifts other than the above. Furthermore, nuclear spin of atomic nuclei other than the atomic nuclei having the chemical shift corresponding to the center frequency of the radiofrequency pulse in an excited state is pseudo-saturated by applying dephase field gradient. Further, it is possible to excite only the nuclear spin of the atomic nuclei having chemical shift corresponding to the center frequency of the radiofrequency pulse by applying in succession the field gradient for selecting the slice and also radiating a radiofrequency pulse. Then, magnetic resonance signals provided with two-dimensional space information and chemical shift information are detected and image reconstruction processing is applied, thereby to obtain a space distribution image of atomic nuclei having predetermined chemical shifts among a plurality of chemical shifts.

Besides, since it is possible to set the spectral bandwidth to be measured arbitrarily to a value of a peak width of the peak intended to be measured, it is possible to make the inversion period of the field gradient longer and to improve the spatial resolution. By performing a series of operations described above while setting the center frequency of the radiofrequency pulse to the frequency of every chemical shift, an atomic nucleus density image in which n types of chemical shift images or at least a part of n types of chemical shift images are computed is obtainable. Further, it is possible to widen the substantial measurement spectral bandwidth by placing the obtained peaks in a row in the axial direction of the chemical shift at this time. Thus, it becomes possible to set the spatial resolution and the spectral bandwidth independently.

Further, in the third method, excitation and magnetic resonance signal measurement relating to n types of different chemical shifts are performed while varying the type of the nuclear spin of the atomic nuclei having n types of different chemical shifts, and furthermore, excitation and magnetic resonance signal measurement are repeated a plurality of times after magnetization is recovered with respect to each of the n types of different chemical shifts. It becomes possible to set the spatial resolution and the spectral bandwidth independently without extending time of measurement by making time interval of excitation of each chemical shift performed a plurality of times repeatedly sufficiently short as compared with the spin-lattice relaxation time of the type of nuclear spin intended to be measured.

Further, in respective methods described above, it is possible to obtain the internal distribution of information relating to efficient chemical shift by measuring beforehand the chemical shift spectrum included in an object through the measurement using prescan, i.e., a pulse sequence in which application of field gradient for providing space information in eliminated before the present measurement is performed.

As described above, according to the present invention, it is possible to provide magnetic resonance imaging capable of setting the spatial resolution and the spectral bandwidth independently in the high-speed MRSI.

BRIEF DESCRIPTION OF THE DRAWINGS

FIG. 2 shows a pulse sequence by a conventional multiple encoding method;

DESCRIPTION OF THE PREFERRED
EMBODIMENTS

Figure 1:
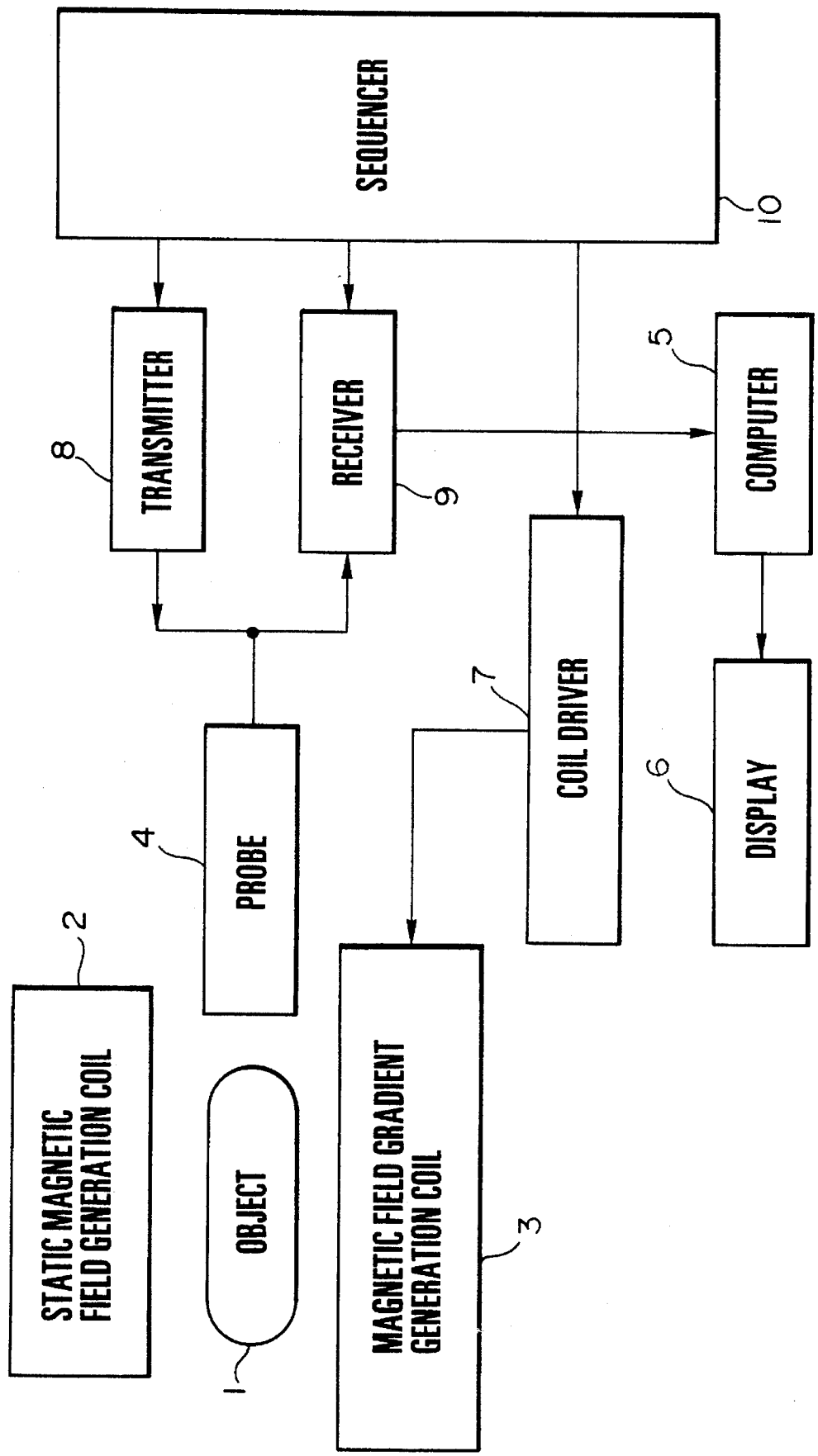
FIG. 1 is a block diagram of a magnetic resonance imaging apparatus applied with the present invention.

Embodiments of the present invention will be described hereinafter with reference to the drawings. FIG. 1 shows a structure of a magnetic resonance imaging apparatus applied with the present invention. An object 1 is disposed in a uniform static magnetic field generated by means of a static magnetic field generation coil 2. A field gradient for slice selection is applied using a magnetic field gradient generation coil 3 for generating field gradients in different three directions, and the object 1 is irradiated with a radiofrequency pulse by a probe 4. With this, a slice intended to be measured is excited selectively so as to produce a magnetic resonance phenomenon, and a magnetic resonance signal generated from the inside of the object 1 is detected by the probe 4. Image information is generated from the magnetic resonance signal using a computer 5 and is displayed on a display 6. Besides, a coil driver 7 for the magnetic field gradient generation coil 3, a transmitter 8 and a receiver 9 are controlled by a sequencer 10.

FIG. 2 shows an example of a pulse sequence of a high-speed MRSI method for measuring internal distribution of information relating to chemical shifts of an organism which is the object of application of the present invention, and shows an example of a pulse sequence of a conventional multiple encoding method using a spin echo. This sequence will be described briefly hereinafter. By applying $Gs_1$ to a field gradient Gz for slice selection and also radiating a radiofrequency pulse $RF_1$ having a SINC waveform or the like, nuclear spin inside the slice which is the object of measurement is brought down by 90° so as to produce an excited state. Next, space information in a Y-axis direction is given to a magnetic resonance signal generated by excitation by applying a phase encoding field gradient Gy. Furthermore, the nuclear spin in an excited state is inverted by 180° by applying $Gs_2$ to a field gradient Gz for slice selection and also radiating a radiofrequency pulse $RF_2$ having a SINC waveform or the like after the lapse of time Te/2 from irradiation with $RF_1$. Then, when a magnetic resonance signal (Sig) is measured, a field gradient Gx is applied with the sign thereof inverted, thereby to generate echoes including space information in an X-axis direction continuously (this signal is referred to hereinafter as an echo train). Besides, $Gs_1'$ is applied for rephasing the excited nuclear spin. The operation described above is repeated at an interval of repetition time Tr in the number of times corresponding to the number of pixels in a Y-axis direction while varying an application intensity of the encoding field gradient Gy stepwise. It is possible to form a chemical shift image by applying three-dimensional Fourier transform to an obtained three-dimensional data array. However, the method described above has a problem that the spatial resolution and the spectral bandwidth cannot be set independently as described previously.

In magnetic resonance imaging and an apparatus therefor of the present invention, a spectral bandwidth measurable in the measurement of an echo train one time is adopted as a certain restricted bandwidth narrower than the whole region instead of the whole region of a spectrum having a certain bandwidth intended to be measured in order to solve the abovementioned problem. With this, it is possible to improve the spatial resolution. When the measurement spectral bandwidth is narrowed, however, it happens sometimes that a peak located outside the measurement bandwidth shows aliasing inward the measurement bandwidth in accordance with Nyquist's sampling theorem and overlap a peak inside the measurement bandwidth. At this time, since it is possible to vary an aliasing position of the peak outside the measurement bandwidth inward the measurement bandwidth depending on the size of the measurement bandwidth and the center frequency of the measurement bandwidth, it is possible to avoid overlapping with the peak inside the bandwidth by adjusting at least either one of them. With this, it is possible to expand the substantial measurement spectral range. Namely, it becomes possible to set the spatial resolution and the measurement spectral bandwidth independently.

(The first embodiment)

Figure 3A:
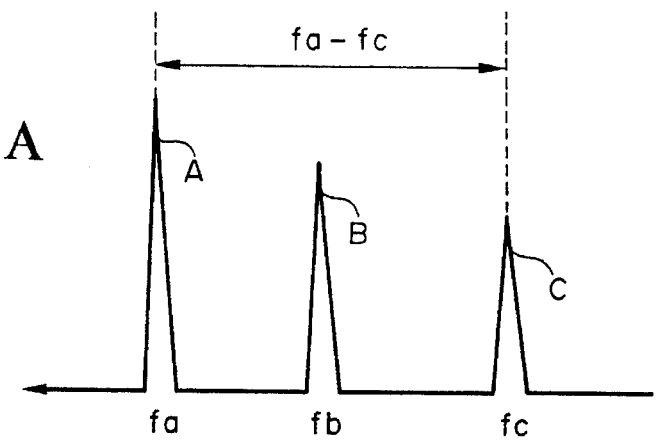
FIGS. 3A, 3B and 3C are diagrams showing examples of spectra including three peaks applied with an embodiment 1.

A first embodiment will be described hereinafter. As an example, a case in which it has been ascertained that a material having a spectrum including three peaks shown in FIG. 3A is in existence in an object by performing measurement using prescan, i.e., a pulse sequence with field gradients Gx and Gy excluded from FIG. 2 in advance before the present measurement is performed will be described. Besides, it is assumed that resonance frequencies of a material A showing a peak A, a material B showing a peak B and a material C showing a peak C are fa[Hz], fb[Hz] and fc[Hz], respectively. In a sequence of a multiple encoding method shown in FIG. 2, by making a period for inverting a sign of field gradient Gx longer, a measurement spectral bandwidth determined by an inverse number of the period of inversion is set to a value smaller than (fa–fc) [Hz], and measurement of a magnetic resonance signal and image reconstruction processing are performed.

Figure 3B:
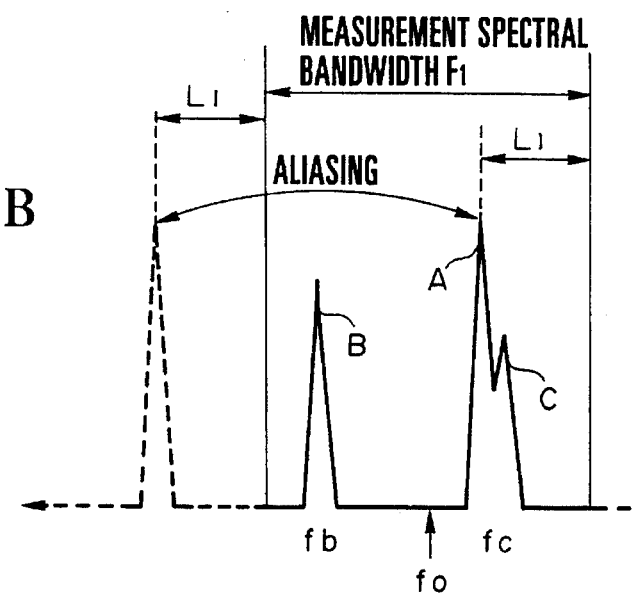
Figure 3C:
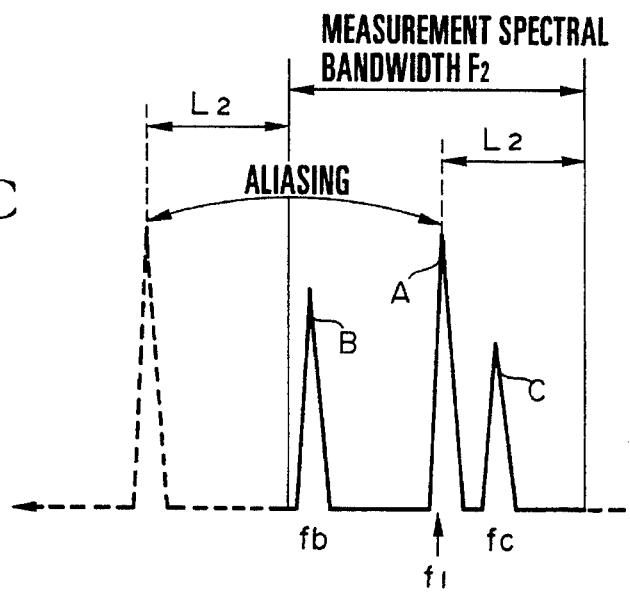

The spectrum shown in FIG. 3B is a chemical shift spectrum of a certain pixel after image reconstruction processing. When the measurement bandwidth is narrowed in this manner, the peak A located outside the measurement bandwidth shows aliasing inward the measurement bandwidth in accordance with Nyquist's sampling theorem and overlaps with the peak C. At this time, since it is possible to vary the aliasing position of the peak A inward the measurement bandwidth and overlaps with the peak C depending on the size of the measurement bandwidth and the center frequency of the measurement bandwidth, it is possible to avoid overlapping of the peak when the measurement bandwidth is set as shown in FIG. 3C for instance. Thus, it is possible to obtain respective spatial distribution images of the material A, the material B and the material C. Further, when a substance having a spectrum including a plurality (N pieces) of peaks is measured, it is also possible to set the measurement spectral range and the spatial resolution independently by performing similar operation.

(The second embodiment)

In the first embodiment, it happens sometimes that a peak located outside the measurement bandwidth shows aliasing in accordance with Nyquist's sampling theorem and overlaps with the inside of the measurement spectral bandwidth when the measurement spectral bandwidth is narrowed. In this case, it is possible to separate an overlapped waveform by using a damped least squares method proposed by Levenberg described in Quarterly of Applied Mathematics Vol. 2, No. 2, pp. 164–168 (1944) which is incorporated herein by reference. With this, it is possible to expand the substantial measurement spectral range. Namely, it becomes possible to set the spatial resolution and the measurement spectral bandwidth independently.

Figure 4A:
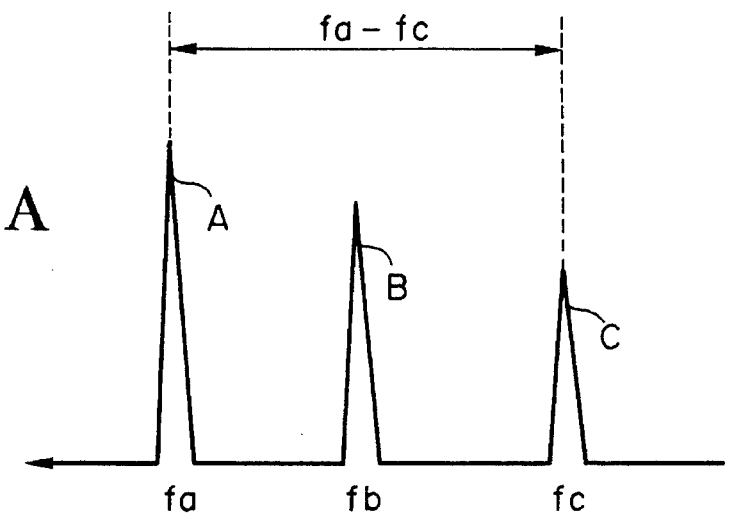
FIGS. 4A, 4B and 4C are diagrams showing examples of spectra including three peaks applied with an embodiment 2.

This method is shown hereunder in the concrete. As an example, a case in which it has been ascertained that a material having a spectrum including three peaks shown in FIG. 4A is in existence in an object by performing measurement using prescan, i.e., a pulse sequence with the field gradients Gx and Gy removed from FIG. 2 in advance before the present measurement is performed will be described.

Figure 4B:
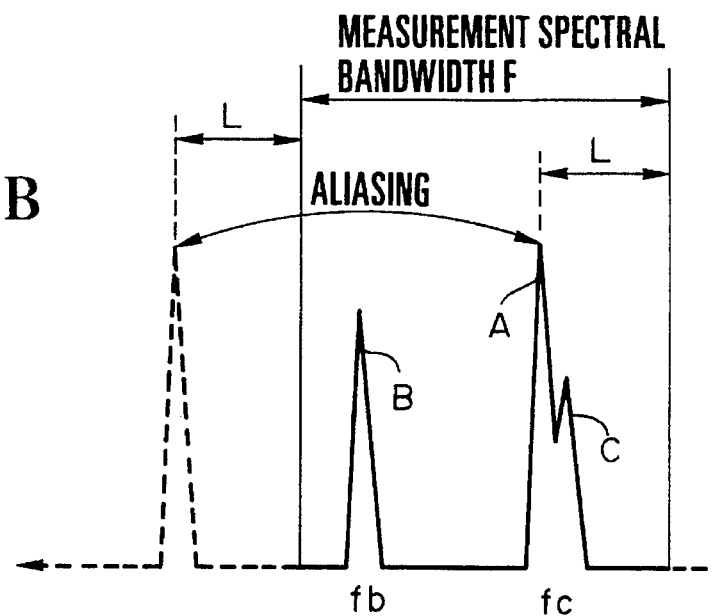
Figure 4C:
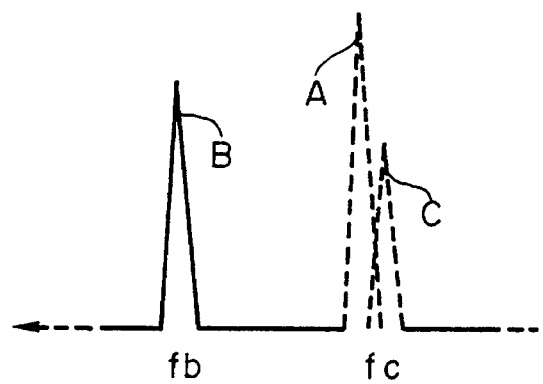

Besides, it is assumed that the resonance frequencies of the material A showing the peak A, the material B showing the peak B and the material C showing the peak C are fa[Hz], fb[Hz] and fc[Hz], respectively. In a sequence of the multiple encoding method shown in FIG. 2, by making a period for inverting a sign of field gradient Gx longer, a measurement spectral bandwidth determined by an inverse number of this inversion period is set to a value of (fa–fc) [Hz] or below, and measurement of a magnetic resonance signal and image reconstruction processing are performed. The spectrum shown in FIG. 4B is a chemical shift spectrum of a certain pixel after image reconstruction processing. When the measurement bandwidth is narrowed in this manner, there is a possibility that the peak A located outside the measurement bandwidth shows aliasing inward the measurement bandwidth in accordance with Nyquist's sampling theorem and overlaps with the peak C. Here, it is possible to separate an overlapped waveform as shown in FIG. 4C by using the damped least squares method or the like and to obtain a spectrum equivalent to that shown in FIG. 4A by returning the peak A which showed aliasing to the original position. Furthermore, it is possible to obtain respective spatial distribution images of the material A, the material B and the material C by separating the overlapped waveform with respect to every spectrum of each pixel.

Further, when a substance having a spectrum including a plurality (N pieces) of peaks is measured, it becomes also possible to set the measurement spectral range and the spatial resolution independently by performing similar operation. Further, it is possible to obtain similar effects by applying the methods described in the first and the second embodiments to another high-speed MRSI method such as an EPSM method and a PREP method which are conventional techniques.

(The third embodiment)

In magnetic resonance imaging and an apparatus therefor of the present embodiment, the whole spectrum region having a certain bandwidth intended to be measured is not measured at a time, but only the regions where peaks intended to be measured are in existence are measured individually. With this, it is possible to eliminate uselessness of measuring a region where a useful peak is not in existence, and to expand the substantial measurement spectral range by placing obtained peaks in a row in an axial direction of the chemical shift. Further, it is possible to narrow the spectral bandwidth when a peak corresponding to one chemical shift is measured arbitrarily to a value of a peak width of the peak, and such a method is shown hereinafter in the concrete.

Figure 5:
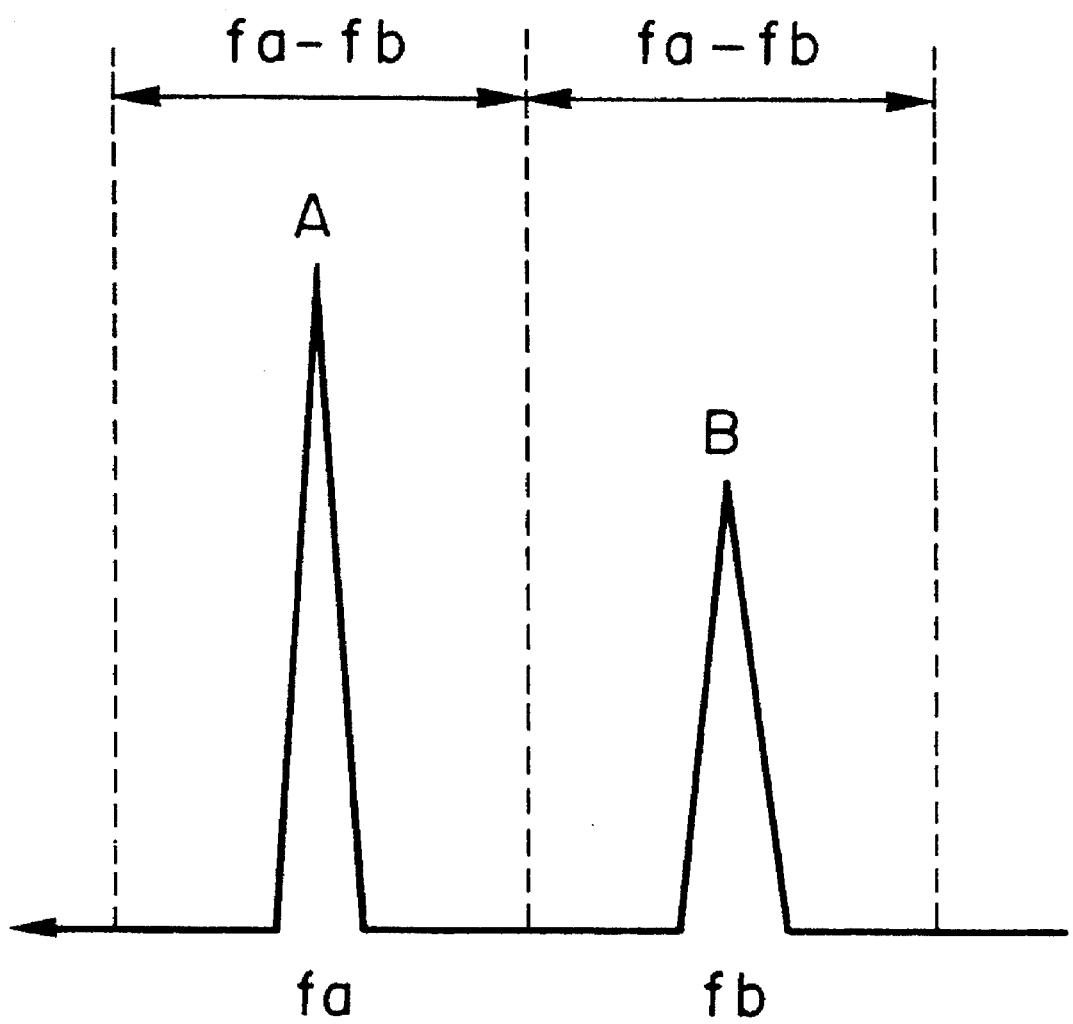
FIG. 5 is a diagram showing an example of a spectrum including two peaks applied with an embodiment 3.

As an example, a case in which it is ascertained that a substance having a spectrum including two peaks shown in FIG. 5 is in existence in an object by performing measurement using prescan, i.e., a pulse sequence with the field gradients Gx and Gy removed from FIG. 2 in advance before the present measurement is performed will be described. Besides, it is assumed that the resonance frequencies of the material A showing the peak A and the material B showing the peak B are fa[Hz] and fb[Hz], respectively. In order to measure only the regions where the peak A and the peak B are in existence individually, in other words, in order to perform excitation of the nuclear spin of atomic nuclei included in the material A and signal measurement thereof and excitation of the nuclear spin of atomic nuclei included in the material B and signal measurement thereof independently, it is required to pseudo-saturate the nuclear spin of the atomic nuclei included in the material B selectively in excitation of the nuclear spin of the atomic nuclei included in the material A and signal measurement thereof, and to pseudo-saturate the nuclear spin of the atomic nuclei included in the material A selectively in the excitation of the nuclear spin of the atomic nuclei included in the material B and the signal measurement thereof.

Figure 6:
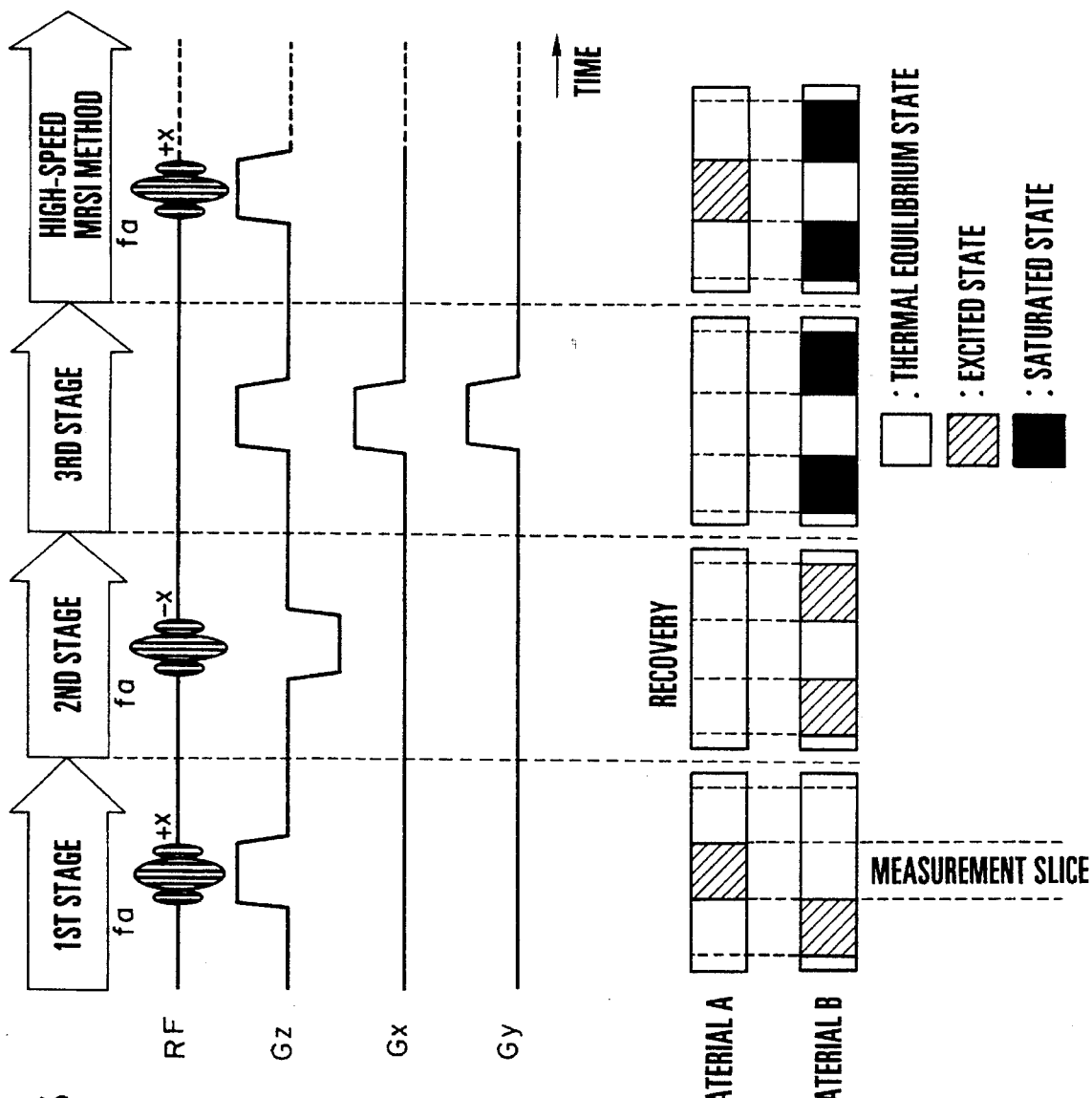
FIG. 6 shows a sequence for selective pseudo-saturation in the present invention.

In order to pseudo-saturate the nuclear spin of the atomic nuclei included in the material B selectively so as to excite only the nuclear spin of the atomic nuclei included in the material A, a sequence composed of three stages shown in FIG. 6 is added to a foregoing part of a conventional high-speed MRSI method sequence such as a sequence of the multiple encoding method shown in FIG. 2.

As a first stage, a radiofrequency magnetic field having a center frequency fa[Hz] (the phase is assumed to be +x as an example) and a field gradient Gz for slice selection (the sign is assumed to be positive as an example) are applied at the same time. FIG. 6 shows the regions to be excited and saturated by the additional sequence for each material.

Not only the nuclear spin of the material A in the measurement slice, but also the nuclear spin of the material B outside the measurement slice (regions shown with oblique lines) are excited by the operation at the first stage. This is due to a fact that it is arranged so that "the difference of slice position on account of chemical shift" reaches just one sheet worth of slice thickness by setting the frequency bandwidth of the radiofrequency magnetic field to (fb–fa) [Hz].

As a second stage, a radiofrequency magnetic field with the phase inverted substantially by 180° (the phase shows –x) and Gz with the sign inverted (the sign shows negative) are applied at the same time. Through such operation, the nuclear spin of the material A in the measurement slice are restored forcibly to the original thermal equilibrium state, and the nuclear spin of another region outside the measurement slice is brought to an excited state in the material B.

At a third stage, spoiling field gradients Gz, Gx and Gy are applied at the same time. Through this operation, the nuclear spin of the material B which has been in an excited state is brought to a pseudo-saturated state (regions smeared out black).

In a conventional high-speed MRSI method sequence following thereafter such as the multiple encoding method sequence shown in FIG. 2, it is possible to substantially excite only the nuclear spin of the material A in the measurement slice by performing excitation using the radiofrequency magnetic field (the phase may be either +x or –x) and Gz (the sign may be either positive or negative) same as those at the first stage or the second stage. At this time, the nuclear spins of the material B are not excited substantially since they are in a saturated state.

Accordingly, it becomes possible to measure only the signal of the material A by executing a high-speed MRSI method sequence such as the multiple encoding method sequence shown in FIG. 2 following to the selective saturation sequence. It becomes also possible to measure only the signal of the material B by performing the similar operation while setting the center frequency of the radiofrequency magnetic field to fb[Hz]. It becomes possible to acquire the image of the material A only and the image of the material B only individually by repeating these two types of operations, respectively, by the number of times' worth of phase encoding. However, the measurement period of time twice as long as conventional measurement period of time is required when acquisition of the image of the material A only and acquisition of the image of the material B only are performed successively. So, the signal is measured in the measurement steps of procedure shown in FIG. 7.

Figure 7:
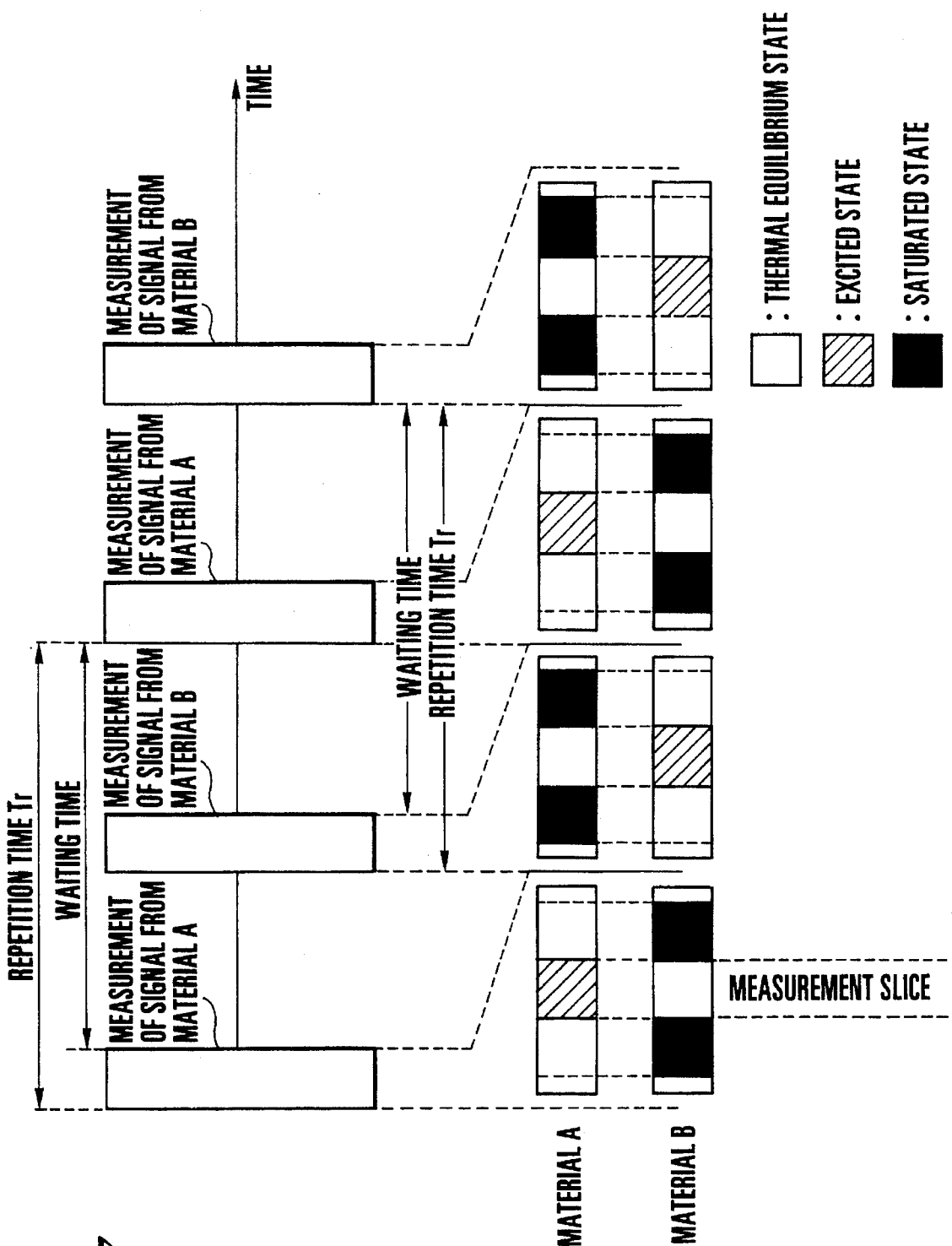
FIG. 7 is a diagram showing measurement steps of procedure for shortening time of measurement.

Namely, signal measurement in two times, i.e., measurement of the signal of the material A only and measurement of the signal of the material B only are performed within the repetition time Tr same as before, and this operation is repeated by the number of times' worth of phase encoding. When attention is paid to the nuclear spins in the measurement slice, excitation and measurement in the repetition time Tr same as before are also repeated (FIG. 7). This is due to a fact that it is arranged so that "the difference of slice position on account of chemical shift" reaches just one sheet worth of slice thickness when selective saturation is made as described previously. With this, it becomes possible, within a period of time for waiting for the nuclear spin on one side to recover naturally to a thermal equilibrium state (which is equal to the period of time obtained by subtracting the period of time required for signal measurement from the repetition time Tr), to measure a magnetic resonance signal from the nuclear spin on the other side which have already recovered to the vicinity of the thermal equilibrium state. Thus, it is possible to obtain spatial distribution images of the material A and the material B in the measurement period of time same as before.

Likewise, when a substance having a spectrum including a plurality (N pieces) of peaks is measured, signal measurement for each material is performed within the repetition time Tr same as before, and this operation is repeated by the number of times' worth of phase encoding. With this, it is possible to obtain a spatial distribution image for each of N pieces of materials in a conventional measurement period of time. Namely, it becomes possible to expand the substantial spectral bandwidth arbitrarily. Besides, it is also possible to use a CHESS method described in Radiology Vol. 156, pp. 441–444 (1985) and a binominal pulse method described in Journal of Magnetic Resonance Vol. 55, p. 283–3∪∪ (1983) as a pseudo-saturation sequence. These document are incorporated herein by reference. In this case, however, the measuring period of time N times as long as the conventional period of time is required when a substance having a spectrum including N pieces of peaks is measured.

Further, it is possible to obtain similar effects by applying the method described in the third embodiment to another high-speed MRSI method such as an EPSM method and a PREP method which are conventional techniques. Further, it becomes possible to obtain only a spatial distribution image of one certain material by applying the method described in the third embodiment to an Echo Planar method described in Journal of Magnetic Resonance Vol. 29, pp. 355–373 (1978) which is incorporated herein by reference.

The present invention has been described in detail, it should be understood that various changes, substitutions and alterations can be made hereto without departing from the spirit and scope of the present invention as defined by the appended claims.

We claim:

1. A high-speed magnetic resonance spectroscopic imaging method comprising the steps of:

a step of exciting a nuclear spin in an object by irradiating the object placed in a space applied with a static magnetic field and field gradients in three different directions, wherein at least one of the field gradients is applied while inverting a sign thereof periodically;

a step of measuring a magnetic resonance signal generated by excitation of the nuclear spin;

a step of applying Fourier transform to the measured magnetic resonance signal thereby to obtain a chemical shift image; and a step of setting a measurement spectral bandwidth to a value not larger than a frequency difference between two different chemical shifts having frequencies remotest from each other among a plurality of chemical shifts intended to be measured, wherein said measurement spectral bandwidth is determined by a reciprocal of an inversion period of the field gradient which is applied while inverting a sign thereof periodically.

2. A high-speed magnetic resonance spectroscopic imaging method according to claim 1, further comprising a step of setting at least either the bandwidth of said measurement spectral bandwidth or a center frequency of said measurement spectral bandwidth so that the peak inside said measurement spectral bandwidth and the peak of a magnetic resonance signal produced by the peak of the magnetic resonance signal located outside said measurement spectral bandwidth aliasing inward said measurement spectral bandwidth are not overlapped.

3. A high-speed magnetic resonance spectroscopic imaging method according to claim 1, further comprising a step of separating by arithmetic processing a peak of a magnetic resonance signal obtained by the peak in said measurement spectral bandwidth and the peak of a magnetic resonance signal produced by the peak of the magnetic resonance signal located outside said measurement spectral band-width aliasing inward said measurement spectral band-width which overlap.

4. A high-speed magnetic resonance spectroscopic imaging method according to claim 1, further comprising a step of measuring in advance a spectrum of a chemical shift existing in a predetermined slice in said object.

5. A high-speed magnetic resonance spectroscopic imaging method comprising the steps of:

a step of applying a first gradient in a first direction for selecting a slice to an object placed in a space applied with a static magnetic field and irradiating the object with a radiofrequency pulse for exciting a nuclear spin;

a step of measuring a magnetic resonance signal produced by applying a second field gradient in a second direction for encoding a phase, applying the first field gradient in the first direction and also applying a radiofrequency pulse for inverting said excited nuclear spin after the lapse of predetermined period of time, and applying a third field gradient in a third direction while inverting a sign thereof periodically;

a step of applying Fourier transform to the measured magnetic resonance signal so as to obtain a chemical shift image; and a step of setting a measurement spectral bandwidth to a value not larger than the frequency difference between the remotest two different chemical shifts among a plurality of chemical shifts intended to be measured and setting at least any one of the bandwidth of said measurement spectral bandwidth and the center frequency of said measurement spectral bandwidth so that the peak in said measurement spectral bandwidth and the peak of the magnetic resonance signal produced by the peak of the magnetic resonance signal located outside said measurement spectral bandwidth aliasing inward said measurement spectral bandwidth do not overlap, wherein said measurement spectral bandwidth is determined by a reciprocal of an inversion period of the third field gradient.

6. A high-speed magnetic resonance spectroscopic imaging method comprising the steps of:

a step of exciting a nuclear spin in an object by irradiating with a radiofrequency pulse the object placed in a space where a static magnetic field and field gradients in a first, a second and a third three different directions are applied;

a step of measuring a magnetic resonance signal generated by excitation of nuclear spin; and a step of applying Fourier transform to the measured magnetic resonance signal so as to obtain a chemical shift image;

said method further comprising:

a first step of setting the bandwidth of said radiofrequency pulse to a value not larger than a frequency difference between the closest two different chemical shifts among a plurality of chemical shifts intended to be measured, and irradiating said object with a first radiofrequency pulse with the center frequency being set to the frequency of a predetermined chemical shift for exciting a predetermined nuclear spin while applying said field gradient in the first direction for selecting a slice in the object;

a second step of irradiating said object with a second radiofrequency pulse being inverted by 180° with respect to said first radiofrequency pulse while applying said field gradient in the first direction with the sign thereof inverted, thereby to excite a nuclear spin other than said predetermined nuclear spin:

a third step of applying at least one of said field gradients in the first, the second and the third directions so as to pseudo-saturate a nuclear spin other than said predetermined nuclear spin excited in said first step and second step;

a fourth step of irradiating with said first radiofrequency pulse or second radiofrequency pulse while applying said field gradient in the first direction, thereby to excite said predetermined nuclear spin; and a fifth step of measuring a magnetic resonance signal generated as the result of said fourth step.

7. A high-speed magnetic resonance spectroscopic imaging method according to claim 6, wherein said first step to said fifth step are repeated for each of a plurality of chemical shifts intended to be measured.

8. A high-speed magnetic resonance spectroscopic imaging method according to claim 6, wherein said first step to said fifth step are repeated for each of a plurality of chemical shifts intended to be measured within a period of time for waiting for nuclear magnetization to recover.

9. A high-speed magnetic resonance spectroscopic imaging according to claim 7, wherein the repetition time interval of repeating said first step to said fifth step is made shorter as compared with the spin-lattice relaxation time of the nuclear spin intended to be measured.

10. A high-speed magnetic resonance spectroscopic imaging method according to claim 6, wherein at least one of said field gradients in the second and the third directions is applied while inverting the sign thereof periodically in said fifth step.

11. A high-speed magnetic resonance spectroscopic imaging method according to claim 6, further comprising a step of measuring in advance the spectrum of the chemical shift existing in a predetermined slice in said object.

12. A high-speed magnetic resonance spectroscopic imaging method comprising:

a step of applying a first field gradient in a first direction for selecting a slice to an object placed in a space applied with a static magnetic field and also irradiating a first radiofrequency pulse for exciting a nuclear spin;

a step of applying a second field gradient in a second direction for encoding a phase, and, after the lapse of a predetermined period of time, applying the first field gradient in the first direction and also applying a second radiofrequency pulse for inverting said excited nuclear spin, and measuring a magnetic resonance signal generated by applying a third field gradient in a third direction while inverting the sign thereof periodically; and a step of applying Fourier transform to the measured magnetic resonance signal so as to obtain a chemical shift image;

wherein said method further comprises:

a first step of setting the bandwidth of said first radiofrequency pulse to a value not larger than a frequency difference between the closest two different chemical shifts among a plurality of chemical shifts intended to be measured, and irradiating said object with said first radiofrequency pulse with the center frequency being set to the frequency of a predetermined chemical shift for exciting a predetermined nuclear spin while applying said first field gradient in the first direction for selecting a slice in the object;

a second step of irradiating said object with said second radiofrequency pulse being inverted by 180° with respect to said first radiofrequency pulse while applying said first field gradient in the first direction with the sign thereof inverted, thereby to excite a nuclear spin other than said predetermined nuclear spin;

a third step of applying at least one of said field gradients in the first, the second and the third directions so as to pseudo-saturate a nuclear spin other than said predetermined nuclear spin excited in said second step;

a fourth step of irradiating with said first radiofrequency pulse applied in said first step or said second radiofrequency pulse applied in said second step while applying said first field gradient in the first direction, thereby to excite said predetermined nuclear spin; and a fifth step of measuring a magnetic resonance signal generated as the result of said fourth step.

13. A high-speed magnetic resonance spectroscopic imaging method according to claim 12, wherein said first step to said fifth step are repeated for each chemical shift of a plurality of chemical shifts intended to be measured.

14. A high-speed magnetic resonance spectroscopic imaging method according to claim 12, wherein said first step to said fifth step are repeated for each chemical shift of a plurality of chemical shifts intended to be measured within a period of time for waiting for nuclear magnetization to recover.

15. A high-speed magnetic resonance spectroscopic imaging method according to claim 13, wherein the repetition time interval of repeating said first step to said fifth step is made shorter as compared with the spin-lattice relaxation time of the nuclear spins intended to be measured.

16. A high-speed magnetic resonance spectroscopic imaging method according to claim 12, further comprising a step of measuring in advance a spectrum of a chemical shift existing in a predetermined slice in said object.

17. A high-speed magnetic resonance spectroscopic imaging method comprising:

a step of exciting nuclear spin in an object by irradiating with a radiofrequency pulse the object placed in a space where a static magnetic field and field gradients in a first, a second and a third different directions are applied;

a step of measuring a magnetic resonance signal generated by excitation of a nuclear spin;

a step of applying Fourier transform to the measured magnetic resonance signal so as to obtain a chemical shift image;

a step of setting the bandwidth of said radiofrequency pulse to a value not larger than the frequency difference between the closest two different chemical shifts among a plurality of chemical shifts intended to be measured and setting a center frequency of said radiofrequency pulse to the frequency of a predetermined chemical shift; and a step of bringing the nuclear spin with the predetermined chemical shift in the slice of said object selected by one of said field gradients into an excited state by said radiofrequency pulse having said center frequency and bringing a nuclear spin of the slice in the vicinity of said slice into a saturated state, respectively.

* * * * *